United States Patent
Chong et al.

(10) Patent No.: US 8,470,130 B2
(45) Date of Patent: Jun. 25, 2013

(54) UNIVERSAL DIE DETACHMENT APPARATUS

(75) Inventors: Chi Ming Chong, Kwai Chung (HK); Jin Hui Meng, Kwai Chung (HK); Man Wai Chan, Kwai Chung (HK); Yuk Cheung Au, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 359 days.

(21) Appl. No.: 12/904,245

(22) Filed: Oct. 14, 2010

(65) Prior Publication Data

US 2011/0088845 A1    Apr. 21, 2011

Related U.S. Application Data

(60) Provisional application No. 61/253,125, filed on Oct. 20, 2009.

(51) Int. Cl.
*B32B 38/10*    (2006.01)

(52) U.S. Cl.
USPC ........... 156/707; 156/716; 156/758; 156/765; 156/932; 156/943; 438/464

(58) Field of Classification Search
USPC ... 156/707, 765, 931, 932, 941, 943; 438/464
See application file for complete search history.

(56) References Cited

U.S. PATENT DOCUMENTS

| 4,850,780 A | 7/1989 | Safabakhsh et al. ........... 414/417 |
| 5,755,373 A | 5/1998 | Nakamura ...................... 228/6.2 |
| 7,470,120 B2 * | 12/2008 | Cheung ......................... 425/190 |
| 7,757,742 B2 * | 7/2010 | Cheung et al. ................ 156/754 |
| 8,142,611 B2 * | 3/2012 | Shibata et al. ................ 156/716 |
| 2004/0115904 A1 | 6/2004 | Cheung et al. ................ 438/464 |
| 2008/0173407 A1 * | 7/2008 | Min et al. ...................... 156/584 |
| 2009/0170290 A1 * | 7/2009 | Maki et al. .................... 438/464 |

* cited by examiner

*Primary Examiner* — Mark A Osele
(74) *Attorney, Agent, or Firm* — Ostrolenk Faber LLP

(57) ABSTRACT

A die detachment apparatus for partially delaminating a die from an adhesive tape on which it is mounted comprises a cover having a support surface that is operative to support the adhesive tape, the support surface including a set of cover holes. A movable pin chuck is positioned below the support surface and includes a set of pin holes that are arranged coaxially with the cover holes. The movable pin chuck is configured for detachably inserting a set of pins in a first desired configuration on some of the pin holes, and the pins are also operable to be relocated on the pin chuck to form another desired configuration. The pins are operative to protrude from the cover by passing through the cover holes to contact and lift the die.

18 Claims, 8 Drawing Sheets

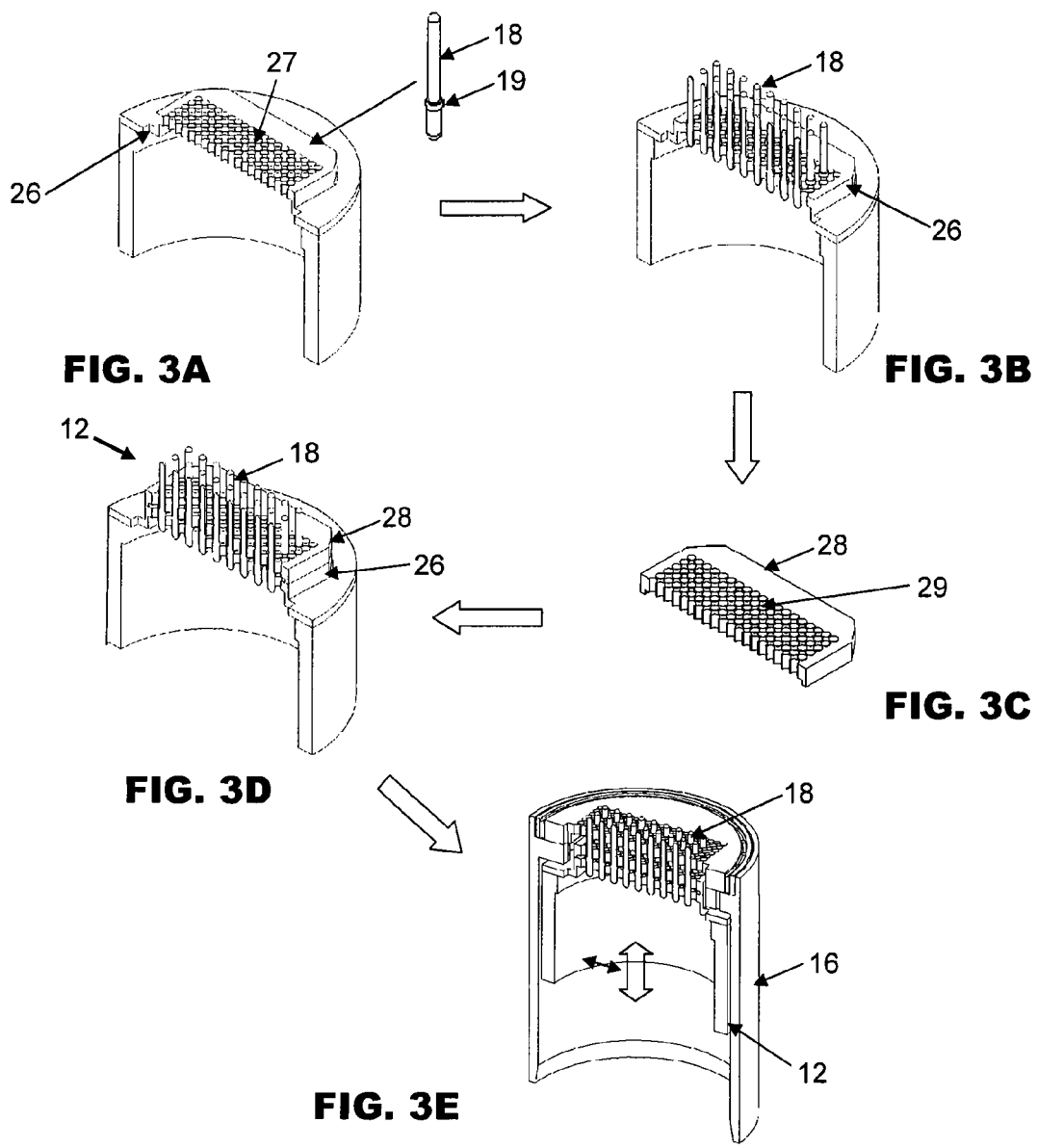

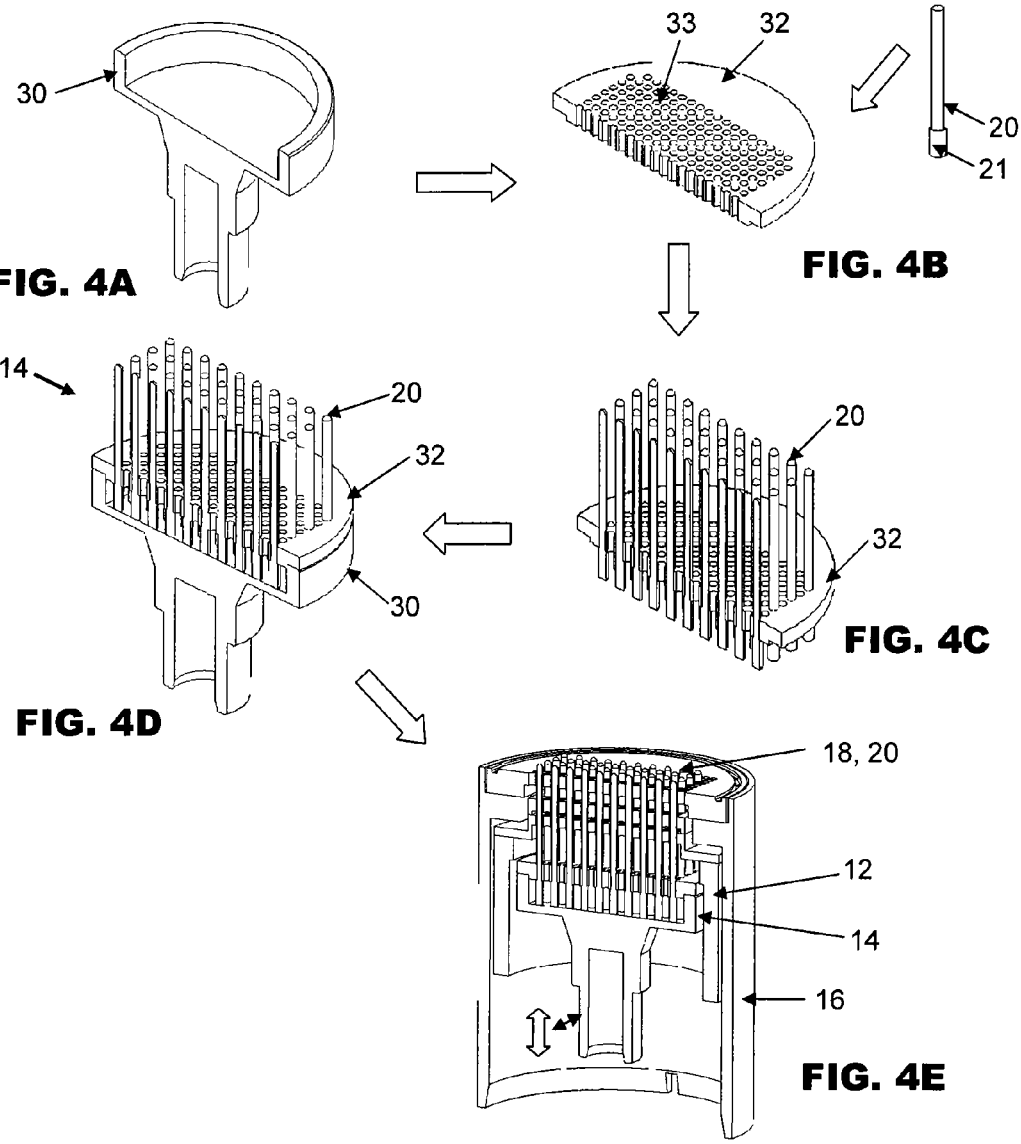

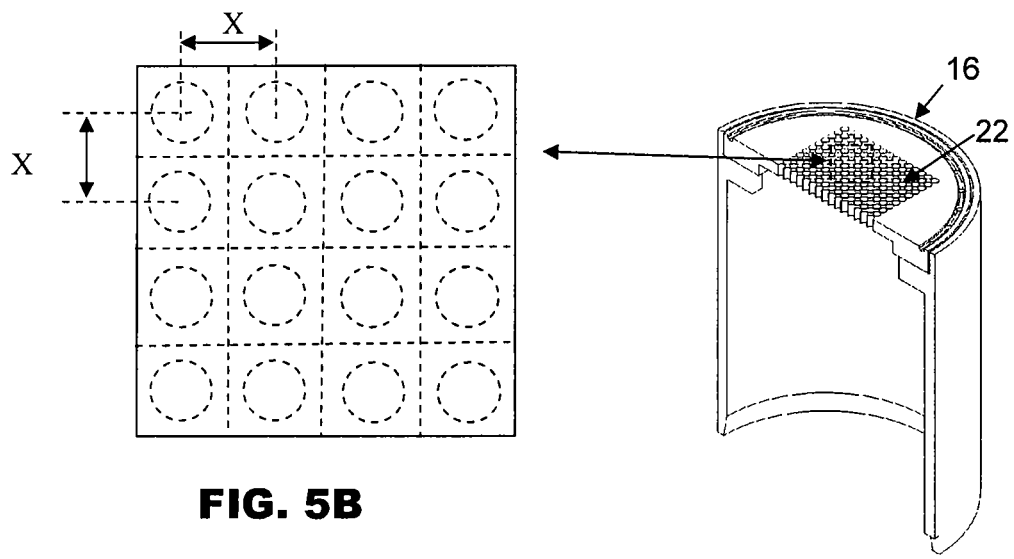
FIG. 5B
FIG. 5A
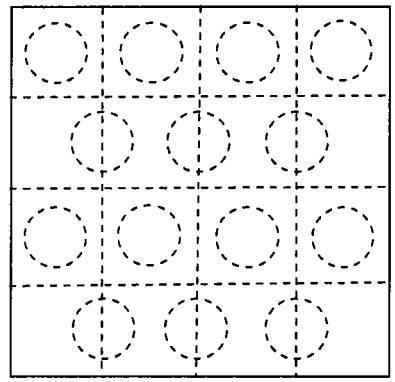
FIG. 5C

UNIVERSAL DIE DETACHMENT APPARATUS

FIELD OF THE INVENTION

The invention relates to the processing of semiconductor devices, and in particular to detaching a semiconductor die from an adhesive tape.

BACKGROUND AND PRIOR ART

Die bonding is one of the key manufacturing processes in electronic packaging in which a semiconductor die singulated from a wafer is detached and picked from an adhesive dicing tape and then bonded onto a substrate, such as a copper leadframe or a printed wiring board ("PWB") substrate.

During the die detachment part of the process, a die from a sawn wafer is detached from an adhesive dicing tape using a technique that involves the utilization of a single pin or a plurality of push-up pins for initiation and completion of the delamination of the die from the dicing tape with the cooperation of vacuum suction from a pick-up tool holding onto the dicing tape. This technique is commonly adopted for both die bonding and flip chip bonding processes.

In the development of high density electronic devices, semiconductor dice have become thinner and larger. It is a challenging task to detach a die from an adhesive dicing tape without damaging the die when the thickness of the die is reduced to below 200 microns or size of about 8×8 mm as the rigidity of the die is reduced and the chances of deformation of the die increase. Hence, an apparatus that is capable of reliably detaching thin and large dice from dicing tapes is becoming a critical component in electronic assembly equipment FIG. 1 is a schematic cross-sectional view of a conventional die detachment tool 102 and a pick-up tool 104 of a die bonder 100. The die detachment tool 102 comprises an ejector 101 which includes an ejector chuck 106 and ejector pins 108 housed in an ejector cap 110. The pick-up tool 104 comprises a collet 112 and a collet shaft 114. An adhesive dicing tape 116 with dice 118 attached is located and held in contact with the surface of the ejector cap 110 by vacuum suction force provided from a vacuum channel 120 through vacuum holes located on the ejector cap 110. The die detachment tool 102 is driven vertically by an actuator.

Various pin assemblies have been implemented in the prior art to detach a die from an adhesive dicing tape. For a die of relatively small size such as 2×2 mm$^2$, a single ejector pin may be positioned at the center of the die to be detached. A single ejector or push-up pin approach is illustrated in U.S. Pat. No. 5,755,373 entitled "Die Push-Up Device" which describes a push-up pin in the form of a needle, which is fastened to a holder for pushing the die so as to separate the die from the dicing tape held by vacuum suction provided by a vacuum assembly. The vacuum assembly is usually fixed in position and the push-up needle is independently movable by a raising-and-lowering motor driven mechanism. When the push-up pin reaches a certain height, the dicing tape is substantially delaminated from the die leaving only a small contact area supported by the pin. The adhesion of the die to the dicing tape is minimal, so that it is possible to lift the said die up from the dicing tape using a vacuum collet without damaging the die. However, as the size of the die increases in area and its thickness decreases, the single push-up pin approach will be inadequate for successful pick-up.

For larger dice and in particular thin dice, multiple ejector pins may be used in order to distribute a push-up force on the die and reduce the pinching effect from the ejector pins. A multiple ejector or push-up pins approach is illustrated in US publication number 2004/0115904 A1 entitled "Apparatus And Method for Thin Die Detachment" which discloses a plurality of ejector pins which partially detach a die from an adhesive surface for detachment by a collet. This is achieved by having each ejector pin contact and raise a second surface of the film opposite the adhesive surface at positions substantially at the corners of the die to be detached within a predetermined distance from the edges of the die.

Alternatively, a two-stage ejection approach illustrated in U.S. Pat. No. 4,850,780 entitled "Pre-Peel Die Ejector Apparatus" attempts to overcome the above problem by providing a telescopic ejector chuck. The telescopic ejector chuck comprises an outer housing surrounded by vacuum suction apertures for pre-peeling the die, and a central housing with a motorized ejector pin connected to an ejector collar for pushing the die away from the dicing tape so that the die is substantially detached from the dicing tape.

A disadvantage of this two-stage approach is the complex design of the vacuum-and-spring-loaded telescopic ejector chuck, so that its size has to be relatively large. With its size constraint, the ejector chuck is found to be only effective for die sizes larger than 5 mm. The apparatus is therefore not applicable to semiconductor devices with smaller die sizes. It would be desirable to devise a die detachment tool that is effective for delaminating both large and small dice.

Further, during die detachment, peeling energy is applied to a die which is being detached by the push-up motion of the ejector pins and the vacuum suction on the dicing tape in order to overcome the interfacial adhesion between the die and the dicing tape. The pinching effect by the ejector pins and the bending of the die may result in deformation of the die. Deformation and detachment are two opposing processes during the pick-up process. When the applied peeling energy reaches the critical interfacial adhesion strength, detachment of the die from the dicing tape will occur. However, the die will crack or break when the deformation of the die reaches the critical strength of the die. The critical strength of the die depends on various factors such as the material of the die, wafer thinning, the pattern on the surface of the die and die sawing quality.

For conventional die detachment using ejector pins, the pinching effect and bending deformation are affected by the number, arrangement and geometry of the ejector pins. For larger die sizes, the ejector pins located at the periphery of the die will also tend to inhibit propagation of delamination towards the center of the die. Furthermore, it is necessary to custom-make an ejector pin chuck to suit dice of various sizes so as to arrange the ejector pins in such a manner as to reduce the pinching effect and bending deformation. It would be desirable to overcome the drawbacks of current die detachment tools as described above.

SUMMARY OF THE INVENTION

It is thus an object of the invention to seek to alleviate the aforesaid shortcomings of the prior art by providing a die detachment apparatus wherein the locations of the push-up pins on a push-up pins assembly can be conveniently changed to cater to critical applications such as the detachment of very thin dice of different sizes.

According to a first aspect of the invention, there is provided a die detachment apparatus for partially delaminating a die from an adhesive tape on which it is mounted, comprising: a cover having a support surface that is operative to support the adhesive tape, the support surface including a set of cover holes; and a movable first pin chuck positioned below the support surface and including a first set of pin holes, the first set of pin holes being arranged coaxially with the cover holes and configured for detachably inserting a first set of pins in a first desired configuration on some of the first set of pin holes, the first set of pins being operable to be relocated on the first pin chuck to form another desired configuration; wherein the first set of pins is operative to protrude from the cover by passing through the cover holes to contact and lift the die.

According to a second aspect of the invention, there is provided a method for partially delaminating a die from an adhesive tape on which it is mounted, comprising the steps of: providing a cover having a support surface including a set of cover holes; providing a movable first pin chuck positioned below the cover, the first pin chuck including a first set of pin holes that are arranged coaxially with the cover holes and configured for detachably inserting a first set of pins in a first desired configuration on some of the first set of pin holes, the first set of pins being operable to be relocated on the first pin chuck to form another desired configuration; inserting the first set of pins into some of the first set of pin holes in the first desired configuration; supporting the adhesive tape on the support surface; and moving the first pin chuck such that the first set of pins passes through the cover holes to protrude from the cover to contact and lift the die.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiment of the invention when considered with the accompanying drawings, in which:

FIGS. 3A to 3E are sectional views illustrating the assembly of a plurality of pre-peeling pins onto the pre-peeling pin chuck of the die detachment apparatus of FIG. 2;

FIGS. 4A to 4E are sectional views illustrating the assembly of a plurality of ejector pins onto the ejector pin chuck of the die detachment apparatus of FIG. 2;

FIGS. 5A to 5C illustrate a sectional view of an ejector cap and plan views of part of the ejector cap showing possible matrix arrangements of ejector cap pin holes on the ejector cap;

DETAILED DESCRIPTION OF THE PREFERRED EMBODIMENT

The preferred embodiment of the present invention will be described hereinafter with reference to the accompanying drawings.

Figure 1:
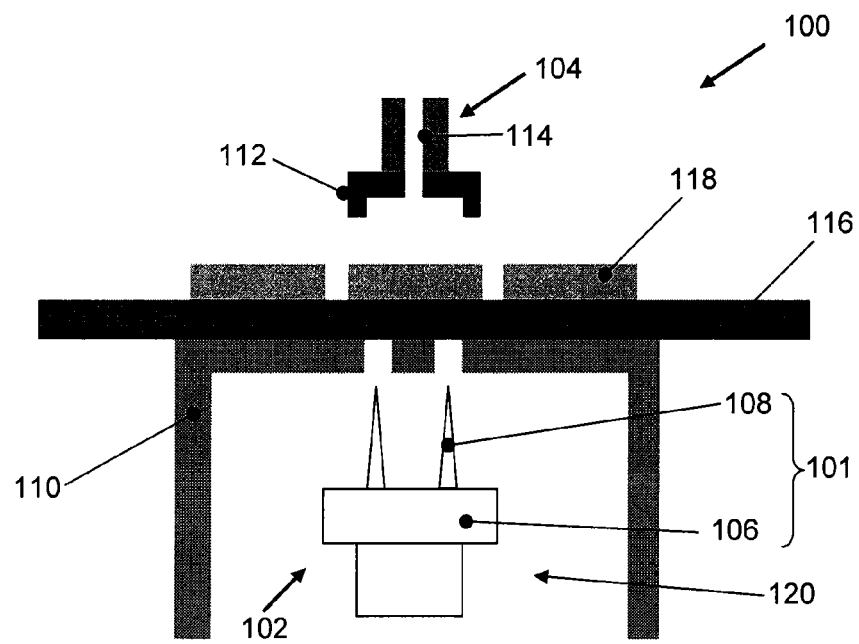
FIG. 1 is a schematic cross-sectional view of a conventional die detachment tool and a pick-up tool of a die bonder.
Figure 2:
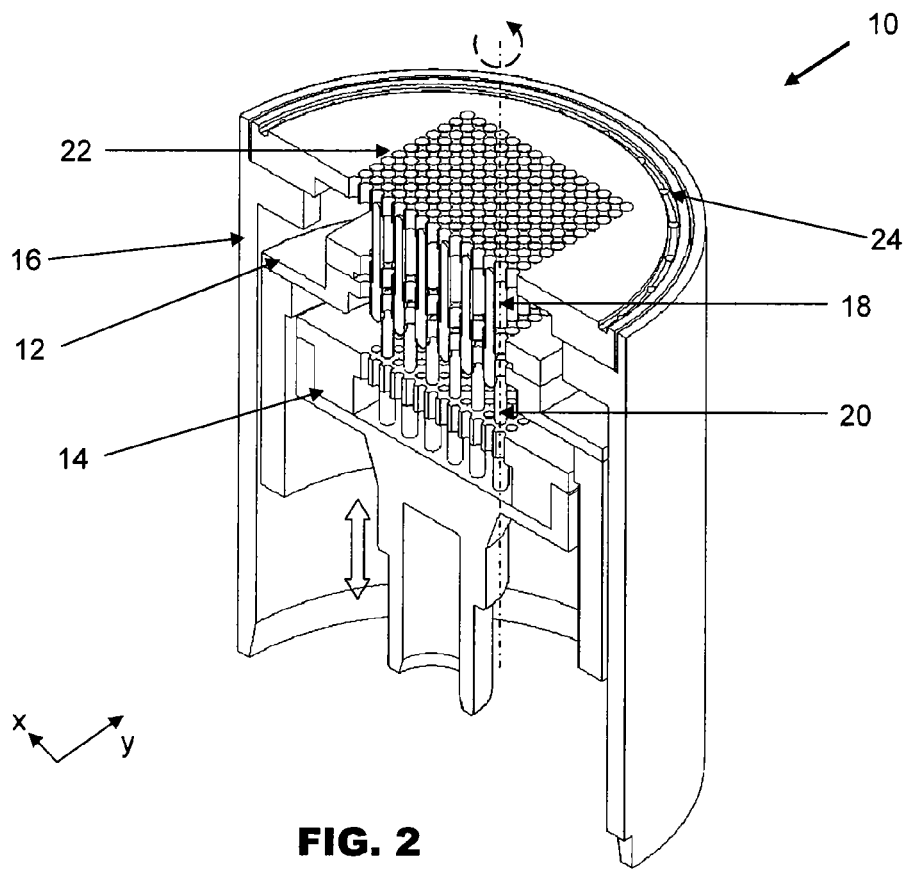
FIG. 2 is a sectional view of a universal die detachment apparatus according to the preferred embodiment of the invention incorporating a pre-peeling pin chuck and an ejector pin chuck.

FIG. 2 is a sectional view of a universal die detachment apparatus 10 according to the preferred embodiment of the invention incorporating a first chuck such as a pre-peeling pin chuck 12 and a second chuck such as an ejector pin chuck 14. The universal die detachment apparatus 10 is operable in single-stage and two-stage die detachment modes for partially delaminating a die from an adhesive tape on which it is mounted. FIG. 2 shows an arrangement of a two-stage die detachment apparatus 10 which deploys both the pre-peeling pin chuck 12 and the ejector pin chuck 14.

The pre-peeling pin chuck 12 is located above the ejector pin chuck 14 and both are housed within an ejector cap 16. The ejector cap 16 has a cover having a support surface including a set of cover holes such as ejector cap pin holes 22, wherein the adhesive tape is supportable on the support surface. Alternatively, the ejector pin chuck 14 may be located between the cover of the ejector cap 16 and the pre-peeling pin chuck 12. The pre-peeling pin chuck 12 and the ejector pin chuck 14 are designed to hold a plurality of pre-peeling pins 18 and a plurality of ejector pins 20 respectively.

The pre-peeling pins 18 and the ejector pins 20 can be mechanically locked to the respective pin chucks 12, 14. The ejector cap pin holes 22 are arranged in a matrix and this arrangement coaxially corresponds with a plurality of pin holes on the pre-peeling pin chuck 12 as well as on the ejector pin chuck 14. Preferably, each ejector cap pin hole 22 is sized to accommodate a single pre-peeling pin 18 or ejector pin 20.

Axial adjustment of the pre-peeling pins 18 and the ejector pins 20 and the three sets of holes are provided by X-Y or horizontal planar adjustment and rotational adjustment of the pre-peeling pin chuck 12 and the ejector cap 16. The coaxial arrangement of the two sets of pins and the three sets of holes facilitates the variable arrangement of the pins protruding through the ejector cap pin holes 22 for die detachment. Thus, the ejector pins 20 can pass through the ejector cap pin holes 22 in the cover of the ejector cap 16 at positions where there are no pre-peeling pins 18 to give rise to two sets of pins 18, 20 that are independently operable.

The pre-peeling pin chuck 12 and the ejector pin chuck 14 are independently movable vertically as each chuck is controlled by a separate actuator (not shown). Further, an array of vacuum holes 24 are arranged circumferentially on the support surface of the ejector cap 16 next to a circumference of the support surface. These vacuum holes 24 together with the ejector cap pin holes 22 on the ejector cap 16 where no pins protrude allow vacuum suction to act on the adhesive tape on which a die to be detached is mounted.

FIGS. 3A to 3E are sectional views illustrating the assembly of the plurality of pre-peeling pins 18 onto the pre-peeling pin chuck 12 of the die detachment apparatus 10 of FIG. 2. FIG. 3A shows a pre-peeling pin chuck base 26 of the pre-peeling pin chuck 12 and a pre-peeling pin 18 which is insertable into the pre-peeling pin chuck 12. The pre-peeling pins 18 can be arranged in different desired configurations on some of the pre-peeling pin holes 27 for delaminating dice of different sizes. The pre-peeling pin chuck 12 comprises a pre-peeling pin chuck base 26 and a pre-peeling pin chuck cover 28 (see FIG. 3C). The pre-peeling pin chuck base 26 has a plurality of pre-peeling pin holes 27 arranged in a matrix to receive the pre-peeling pins 18.

Each pre-peeling pin 18 comprises a pre-peeling pin flange 19 which enables the pre-peeling pin 18 to be mechanically locked to the pre-peeling pin chuck base and cover 26, 28 by securing the pre-peeling pin flange 19 between the pre-peeling pin chuck base and cover 26, 28. This avoids the need to use any mechanical set screw to fix each pre-peeling pin 18 on the pre-peeling pin chuck 12. This provides a versatile re-configurable arrangement of the pre-peeling pins 18 on the pre-peeling pin chuck 12 so that to detach a die of a given size, the user can easily and conveniently relocate the pre-peeling pins 18 on the pre-peeling pin chuck 12 to the desired configuration which is suitable to detach the die without using any tool. It is therefore not necessary to specially fabricate a different pin chuck to delaminate each die of a different size.

FIG. 3B shows an arrangement of the pre-peeling pins 18 mounted on the pre-peeling pin chuck base 26 of the pre-peeling pin chuck 12. FIG. 3C shows the pre-peeling pin chuck cover 28 of the pre-peeling pin chuck 12 which has a plurality of pre-peeling pin holes 29 arranged in the same way as the pre-peeling pin holes 27 on the pre-peeling pin chuck base 26. FIG. 3D shows an arrangement of the pre-peeling pins 18 mounted and locked to the pre-peeling pin chuck base and cover 26, 28. FIG. 3E shows the pre-peeling pins 18 arranged inside the ejector cap 16 which houses the pre-peeling pin chuck 12. The pre-peeling pin chuck 12 is actuated vertically, which projects the pre-peeling pins 18 above the support surface of the ejector cap 16 during die detachment.

FIGS. 4A to 4E are sectional views illustrating the assembly of a plurality of ejector pins 20 onto an ejector pin chuck 14 of the die detachment apparatus 10 of FIG. 2. The ejector pin chuck 14 is independently movable with respect to the pre-peeling pin chuck 12 and comprises an ejector pin chuck base 30 and an ejector pin chuck cover 32 illustrated in FIGS. 4A and 4B respectively. The ejector pin chuck cover 32 comprises a plurality of ejector pin holes 33 for detachably inserting the ejector pins 20 and positions of the ejector pin holes 33 correspond to and are coaxial with the positions of the ejector cap pin holes 22 and pre-peeling pin holes 27 on the ejector cap 16 and the pre-peeling pin chuck base 26 respectively. The ejector pins 20 can be arranged in different desired configurations on some of the ejector pin holes 33 for delaminating dice of different sizes.

FIG. 4B further shows an ejector pin 20 with an ejector pin flange 21 which enables the ejector pin 20 to be mechanically locked to the ejector pin chuck cover 32 of the ejector pin chuck 14 without using any mechanical set screw to fix each ejector pin 20 to the ejector pin chuck 14. The ejector pin flange 21 may be secured between to the ejector pin chuck cover 32 of the ejector pin chuck 14. Therefore, a versatile re-configurable arrangement of the ejector pins 20 onto the ejector pin chuck 14 can also be achieved as in the case of the pre-peeling pins 18 described above. It is hence not necessary to specially fabricate a different pin chuck for delaminating a die of a different size.

FIG. 4C shows an arrangement of the ejector pins 20 mounted and locked to the ejector pin chuck cover 32 of the ejector pin chuck 14. FIG. 4D shows the ejector pins 20 mechanically locked to the ejector pin chuck cover 32 and resting on the ejector pin chuck base 30 of the ejector pin chuck 14 without using any mechanical set screw to fix each ejector pin 20 to the ejector pin chuck 14.

FIG. 4E shows the pre-peeling pins 18 and the ejector pins 20 arranged inside the ejector cap 16 for a two-stage die detachment process. The ejector pin chuck 14 is vertically actuated independently from the actuation of the pre-peeling pin chuck 12 to project the ejector pins 20 above the support surface of the ejector cap 16 after passing through the ejector cap pin holes 22 and the pre-peeling pin holes 27, 29 where pre-peeling pins 18 are not located.

In one embodiment of a single-stage die detachment apparatus, only the ejector pin chuck 14 and plurality of ejector pins 20 would be arranged as aforesaid without the need to install the pre-peeling pin chuck 12 and pre-peeling pins 18. In another embodiment of a two-stage die detachment apparatus where the ejector pin chuck 14 is located between the ejector cap 16 and the pre-peeling pin chuck 12, the ejector pin holes 33 would be coaxial with the pre-peeling pin holes 27, 29, and the pre-peeling pins 18 would pass through the ejector pin holes 33 and ejector cap pin holes 22 in order to protrude from the support surface of the ejector cap 16.

FIGS. 5A to 5C illustrate a sectional view of the ejector cap 16 and plan views of the ejector cap 16 showing possible matrix arrangements of the ejector cap pin holes 22 on the ejector cap 16. The same arrangement is exhibited by the pre-peeling pin holes 27, 29 on the pre-peeling pin chuck 12 and the ejector pin holes 33 on the ejector pin chuck 14. FIG. 5A shows a sectional view of the ejector cap 16 having a matrix arrangement of the ejector cap pin holes 22 on the top surface of the ejector cap 16. FIG. 5B shows an arrangement of the ejector cap pin holes 22 in multiple rows and columns where each ejector cap pin hole 22 is separated from adjacent ejector cap pin holes 22 in the next column or row by a pitch X where X may range from 0.8 mm to 1.6 mm. FIG. 5C shows an alternative arrangement of ejector cap pin holes 22 which are arranged in multiple rows, and each row of ejector cap pin holes 22 is columnarly offset from an adjacent row of ejector cap pin holes 22.

Figure 6:
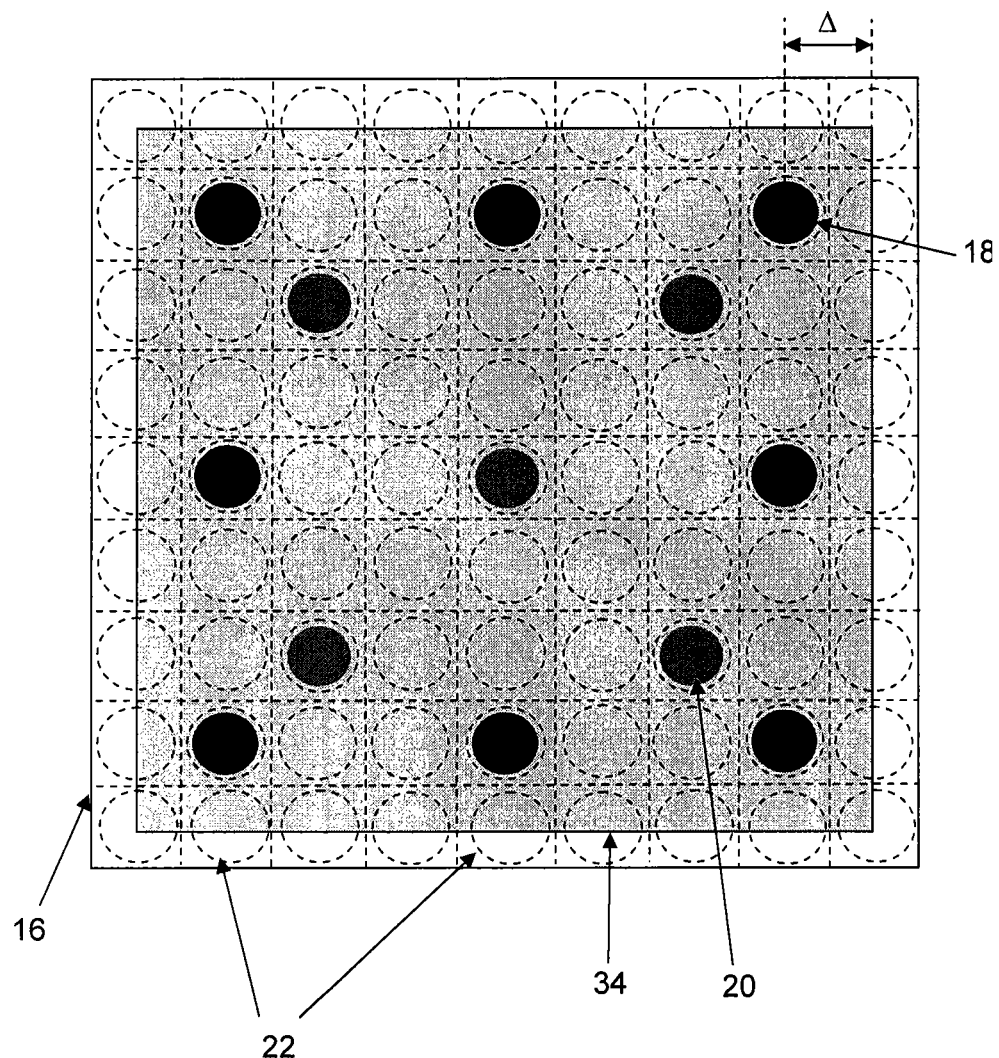
FIG. 6 is an exemplary arrangement of ejector pins and pre-peeling pins with respect to the matrix arrangement of ejector cap pin holes on the ejector cap suitable for delaminating a 8×8 mm die.

FIG. 6 is an exemplary arrangement of the ejector pins 20 and the pre-peeling pins 18 with respect to the matrix arrangement of ejector cap pin holes 22 on the ejector cap 16 suitable for delaminating a 8×8 mm die 34. The pre-peeling pins 18 are located along the periphery of the die 34 and the ejector pins 20 are arranged towards the center of the die 34. There is a predetermined distance Δ, between the edge of the die 34 and the centre of the peripheral pre-peeling pin 18 or the ejector pin 20 (in a single stage process) located nearest to the edge of the die 34. This predetermined distance Δ is dependent on the pitch X between adjacent ejector cap pin holes 22, and Δ should be less than or equal to X. For example, for a given pitch X=1 mm, the maximum distance of Δ is 1 mm. This configuration of the pins is particularly useful for detaching large and thin dice. By varying the number and arrangement of the pins, delaminating dice of various thickness and sizes can be carried out effectively with minimal deformation or breakage of the dice.

Figure 7A:
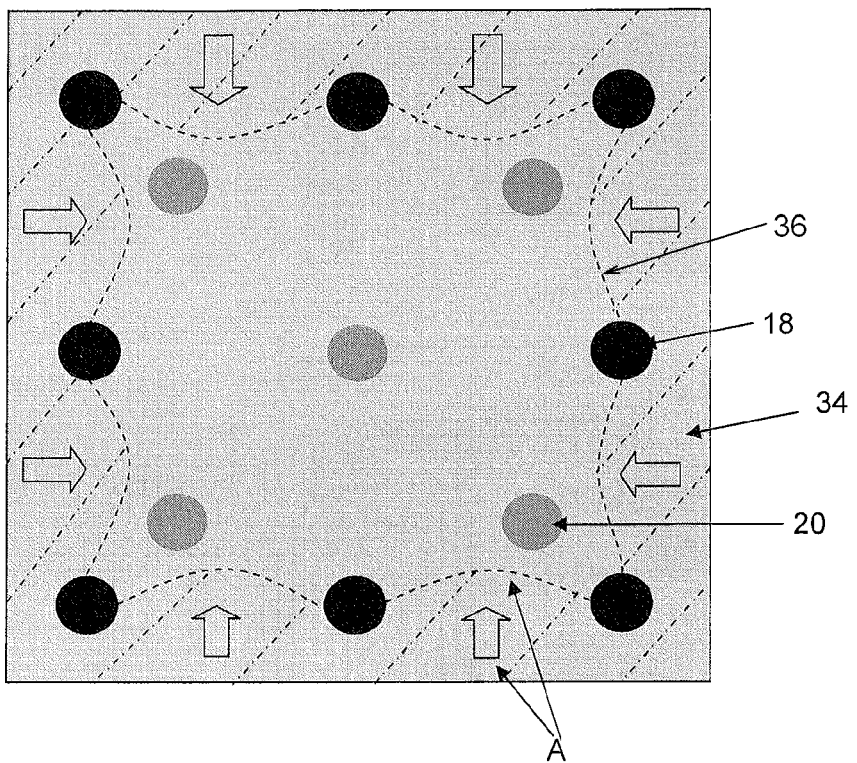
FIGS. 7A and 7B illustrate delamination of a die from an adhesive tape when applying the exemplary arrangement of ejector pins and pre-peeling pins as shown in FIG. 6.
Figure 7B:
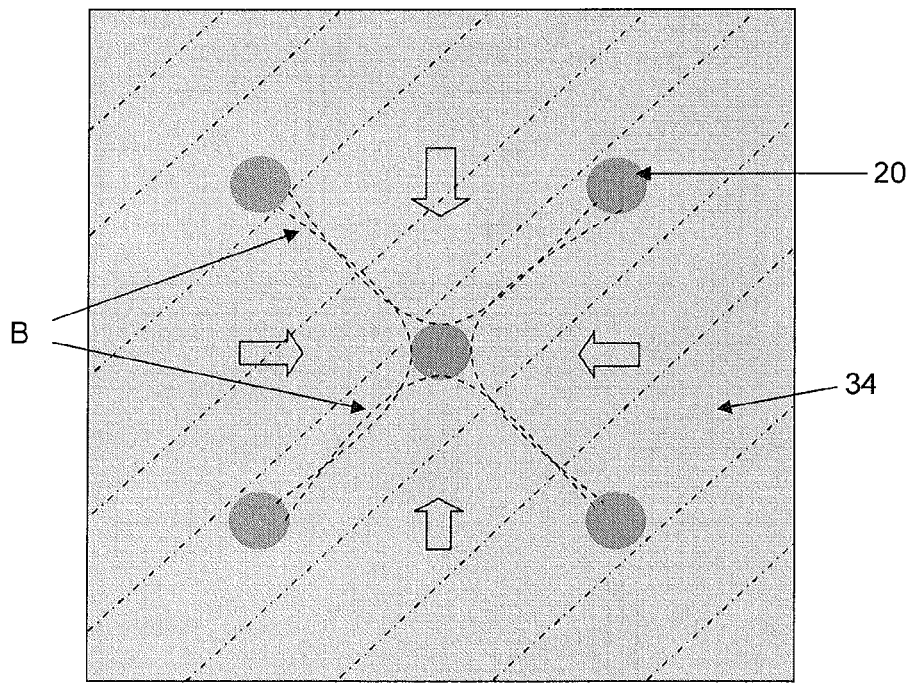

FIGS. 7A and 7B illustrate delamination of a die 34 from an adhesive tape 36 when applying the exemplary arrangement of ejector pins 20 and pre-peeling pins 18 as shown in FIG. 6. FIG. 7A shows both the ejector pins 20 and the pre-peeling pins 18 at a pre-peeling level which is a raised distance above the surface of the ejector cap 16. Detachment is propagated from the edges of the die 34 to the positions of the pre-peeling pins 18 which are located near the periphery of the die 34. Further detachment towards the centre of the die 34 is inhibited by these peripheral pre-peeling pins 18. The delaminated area is indicated as a region A in FIG. 7A.

FIG. 7B shows that the delamination of the die 34 from the adhesive tape 36 has propagated towards the center of the die 34 that is, from the region A to where the ejector pins 20 are located. This is achieved when the pre-peeling pins 18 have been moved down away from the pre-peeling level or the ejector pins 20 have been moved up. The relative movement of the pre-peeling pins 18 and the ejector pins 20 overcomes the inhibition of the pre-peeling pins 18 located at the periphery of the die 34 so that the detachment of the die 34 from the adhesive tape 36 can be further propagated to where the ejector pins 20 are positioned. The extended delaminated area is indicated as region B in FIG. 7B.

Figure 8A:
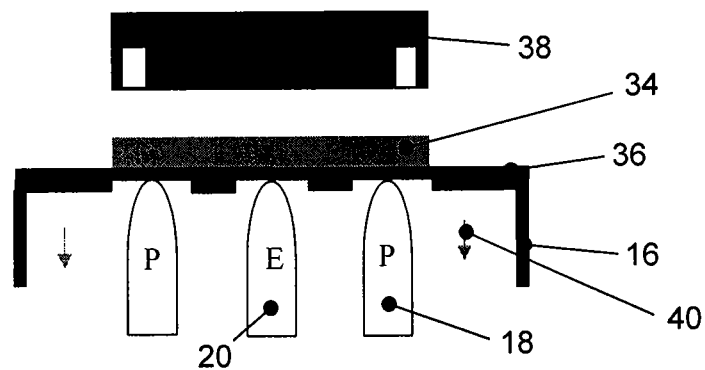
FIGS. 8A to 8F show an exemplary operation sequence for delaminating a die by utilizing a two-stage die detachment mode of the die detachment apparatus of FIG. 2.
Figure 8B:
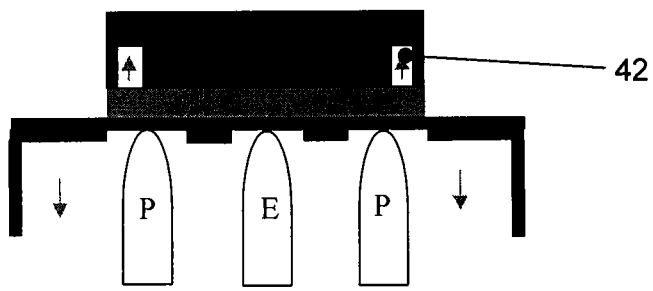

FIGS. 8A to 8F show an exemplary operation sequence for delaminating a die 34 by utilizing a two-stage die detachment mode of the die detachment apparatus 10 of FIG. 2. In FIG. 8A, the die 34 to be picked up from an adhesive tape 36 is located at a pick-up position on the ejector cap 16. Vacuum suction 40 is applied to the ejector cap 16 so that the adhesive tape 36 is held against the top surface of the ejector cap 16 by vacuum suction. A collet 38 of a bond head is moved to contact the surface of the die 34 and the collet 38 holds the die 34 using a vacuum force 42 from the collet 38 as shown in FIG. 8B. Both sets of pre-peeling pins 18 and ejector pins 20 are positioned at the same level below the adhesive tape 36 to which the die 34 is mounted.

Figure 8C:
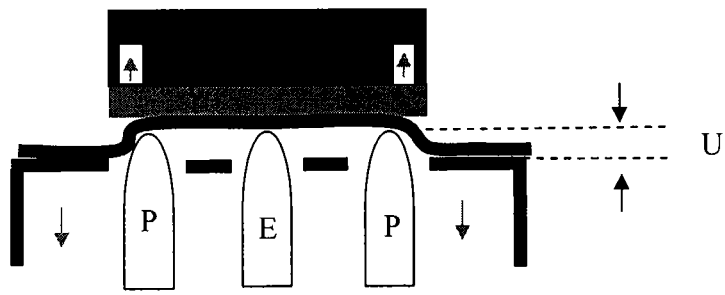

FIG. 8C shows the initial pre-peeling step when the pre-peeling pins 18 and the ejector pins 20 project vertically upwards to a predetermined level U or a pre-peeling level above the surface of the ejector cap 16. The pre-peeling pins 18 and ejector pins 20 are held in this position for a period of time which initiates detachment of the die 34 at the periphery of the die 34 from the adhesive tape 36. The detachment propagates from the periphery of the die 34 towards the pre-peeling pins 18 and further propagation of the delamination beyond the pre-peeling pins 18 is inhibited.

Figure 8D:
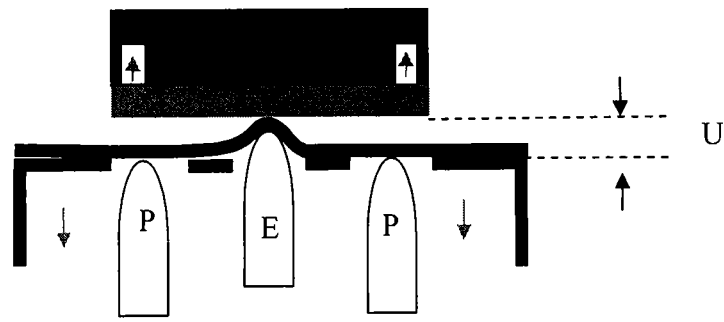
Figure 8E:
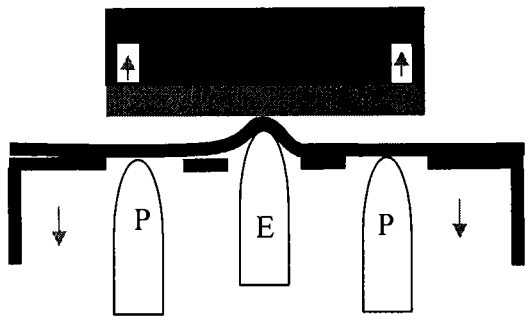
Figure 8F:
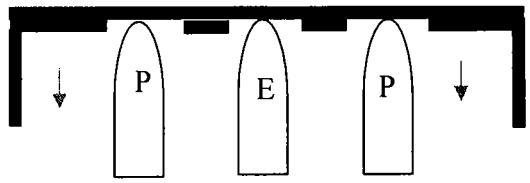

This inhibition effect of the pre-peeling pins 18 may be overcome by moving the pre-peeling pins 18 and the ejector pins 20 relative to each other by either moving the ejector pins 20 upwards or the pre-peeling pins 18 downwards as shown in FIG. 8D. This permits further propagation of the delamination of the die 34 from the pre-peeling pins 18 towards the center of the die 34 so that the die 34 is sufficiently detached for picking up by the collet 38. After the die 34 has been detached from the adhesive tape 36, the ejector pins 20 move down to the level of the ejector cap 16 as shown in FIG. 8F.

It should be appreciated that the universal single and two-stage die detachment apparatus in accordance with the preferred embodiment of the invention provides a versatile die detachment tool for delaminating dice of various sizes effectively. The apparatus can be used for a single-stage and/or a two-stage die detachment process. The pins designed with flanges are mechanically locked to the pin chuck without using any mechanical components such as set screws. This method of mechanical locking as well as the coaxial arrangement of the various sets of holes on the ejector cap, pre-peeling pin chuck and the ejector pin chuck and the ejector and pre-peeling pins in the apparatus provides a co-planarity and leveling for the pins. Co-planarity reduces deformation of the die during die detachment. The number and location of the pre-peeling and ejector pins used are conveniently changeable as desired by the operator so that there is no need to specially fabricate a different pin chuck for detaching a die of a different size.

The two-stage die detachment application which uses separate sets of pre-peeling and ejector pins provides a variable form factor for the die detachment process allowing propagation of the die detachment towards the center of the die as described above. The pattern and arrangement of the pre-peeling pins and the ejector pins are particularly useful for delaminating thin dice for the pick-up application. This is achieved by the matrix arrangement of the ejector cap pin holes on the ejector cap which permits the pre-peeling pins and the ejector pins to be configurably arranged and mounted to the respective pin chucks.

The invention described herein is susceptible to variations, modifications and/or addition other than those specifically described and it is to be understood that the invention includes all such variations, modifications and/or additions which fall within the spirit and scope of the above description.

The invention claimed is:

1. A die detachment apparatus for partially delaminating a die from an adhesive tape on which it is mounted, comprising:
   a cover having a support surface that is operative to support the adhesive tape, the support surface including a set of cover holes;
   a movable first pin chuck positioned below the support surface and including a first set of pin holes, the first set of pin holes being arranged coaxially with the cover holes and configured for detachably inserting a first set of pins in a first desired configuration into some of the first set of pin holes, the first set of pins being operable to be relocated on the first pin chuck to form another desired configuration; and
   a second pin chuck positioned below the first pin chuck and independently movable with respect to the first pin chuck, the second pin chuck including a second set of pin holes that are arranged coaxially with the cover holes and the first set of pin holes, and configured for detachably inserting a second set of pins in a second desired configuration into some of the second set of pin holes, the second set of pins being operable to be relocated on the second pin chuck to form another desired configuration;
   wherein the first set of pins is operative to protrude from the cover by passing through the cover holes to contact and lift the die, and
   the second set of pins is operative to protrude from the cover by passing through the first set of pin holes and the cover holes to contact and lift the die independently of the first set of pins.

2. The die detachment apparatus as claimed in claim 1, wherein the first set of pins is located nearer to edges of the die than the second set of pins, and the first set of pins is operative to initiate peeling between the die and the adhesive tape and the second set of pins is operative to produce further delamination between the die and the adhesive tape after the first set of pins has initiated delamination.

3. The die detachment apparatus as claimed in claim 1, wherein the second set of pins is arranged to pass through the first set of pin holes where pins of the first set of pins are not located.

4. The die detachment apparatus as claimed in claim 1, wherein the cover is comprised in an ejector cap that houses the first and second pin chucks in an enclosure.

5. The die detachment apparatus as claimed in claim 1, further comprising vacuum holes arranged next to a circumference of the support surface for generating a vacuum suction force onto the adhesive tape at the positions of the vacuum holes.

6. The die detachment apparatus as claimed in claim 1, wherein the first pin chuck comprises a pin chuck base and a pin chuck cover, and each pin of the first set of pins comprises a pin flange that is configured to be located between the pin chuck base and the pin chuck cover for mechanically locking the pin.

7. The die detachment apparatus as claimed in claim 1, wherein the pins of the first set and the second set of pins are operable to be relocated to form another desired configuration for delaminating a die having a different size.

8. A die detachment apparatus for partially delaminating a die from an adhesive tape on which it is mounted, comprising:

a cover having a support surface that is operative to support the adhesive tape, the support surface including a set of cover holes;

a movable first pin chuck positioned below the support surface and including a first set of pin holes, the first set of pin holes being arranged coaxially with the cover holes and configured for detachably inserting a first set of pins in a first desired configuration into some of the first set of pin holes, the first set of pins being operable to be relocated on the first pin chuck to form another desired configuration; and a second pin chuck positioned above the first pin chuck and below the cover and independently movable with respect to the first pin chuck, the second pin chuck including a second set of pin holes that are arranged coaxially with the cover holes, and configured for detachably inserting a second set of pins in a second desired configuration into some of the second set of pin holes, the second set of pins being operable to be relocated on the second pin chuck to form another desired configuration;

wherein the first set of pins is operative to protrude from the cover by passing through the cover holes to contact and lift the die, and the second set of pins is operative to protrude from the cover by passing through the cover holes to contact and lift the die independently of the first set of pins.

9. The die detachment apparatus as claimed in claim 1, wherein a pitch between cover holes which are adjacent to each other is between 0.8 mm and 1.6 mm.

10. The die detachment apparatus as claimed in claim 1, wherein a distance between an edge of the die and a peripheral pin of the first set and the second set of pins located nearest the edge of the die is less than or equal to a pitch between adjacent cover holes.

11. The die detachment apparatus as claimed in claim 1, wherein the cover holes are arranged in multiple rows and each row of cover holes is columnarly offset from an adjacent row of cover holes.

12. The die detachment apparatus as claimed in claim 1, wherein each cover hole is sized to accommodate a single pin of the first set and the second set of pins.

13. Method for partially delaminating a die from an adhesive tape on which it is mounted, comprising the steps of:

providing a cover having a support surface including a set of cover holes;

providing a movable first pin chuck positioned below the cover, the first pin chuck including a first set of pin holes that are arranged coaxially with the cover holes and configured for detachably inserting a first set of pins in a first desired configuration into some of the first set of pin holes, the first set of pins being operable to be relocated on the first pin chuck to form another desired configuration;

inserting the first set of pins into some of the first set of pin holes in the first desired configuration;

supporting the adhesive tape on the support surface;

moving the first pin chuck such that the first set of pins passes through the cover holes to protrude from the cover to contact and lift the die;

providing a second pin chuck positioned below the first pin chuck and independently movable with respect to the first pin chuck, the second pin chuck including a second set of pin holes that are arranged coaxially with the cover holes and the first set of pin holes, and configured for detachably inserting a second set of pins in a second desired configuration into some of the second set of pin holes, the second set of pins being operable to be relocated on the second pin chuck to form another desired configuration;

inserting the second set of pins into some of the second set of pin holes in the second desired configuration; and moving the second pin chuck such that the second set of pins passes through the first set of pin holes and the cover holes to protrude from the cover to contact and lift the die.

14. Method as claimed in claim 13, wherein the first pin chuck comprises a pin chuck base and a pin chuck cover and each pin of the first set of pins comprises a pin flange, and wherein the step of inserting the first set of pins further comprises the step of mechanically locking each pin by securing the pin flange between the pin chuck base and the pin chuck cover.

15. Method as claimed in claim 13, further comprising the step of relocating the first set and the second set of pins to form another desired configuration for delaminating a die having a different size.

16. Method as claimed in claim 13, wherein a distance between an edge of the die and a peripheral pin of the first set and the second set of pins located nearest the edge of the die is less than or equal to a pitch between cover holes which are adjacent to each other.

17. Method as claimed in claim 13, wherein each cover hole is sized to accommodate a single pin of the first set and the second set of pins.

18. Method for partially delaminating a die from an adhesive tape on which it is mounted, comprising the steps of:

providing a cover having a support surface including a set of cover holes;

providing a movable first pin chuck positioned below the cover, the first pin chuck including a first set of pin holes that are arranged coaxially with the cover holes and configured for detachably inserting a first set of pins in a first desired configuration into some of the first set of pin holes, the first set of pins being operable to be relocated on the first pin chuck to form another desired configuration;

inserting the first set of pins into some of the first set of pin holes in the first desired configuration;

supporting the adhesive tape on the support surface;

moving the first pin chuck such that the first set of pins passes through the cover holes to protrude from the cover to contact and lift the die;

providing a second pin chuck positioned above the first pin chuck and below the cover and which is independently movable with respect to the first pin chuck, the second pin chuck including a second set of pin holes that are arranged coaxially with the cover holes, and configured for detachably inserting a second set of pins in a second desired configuration into some of the second set of pin holes, the second set of pins being operable to be relocated on the second pin chuck to form another desired configuration;

inserting the second set of pins into some of the second set of pin holes in the second desired configuration; and moving the second pin chuck such that the second set of pins passes through the cover holes to protrude from the cover to contact and lift the die.

* * * * *